(12) United States Patent
Bai et al.

(10) Patent No.: US 6,614,660 B1
(45) Date of Patent: Sep. 2, 2003

(54) THERMALLY ENHANCED IC CHIP PACKAGE

(75) Inventors: Jin-Chyung Bai, Hsin Chu (TW); Cheng-Hui Lee, Hsin Chu (TW); Weiheng Shan, Hsin Chu (TW)

(73) Assignee: Ultratera Corporation, Hsin Chu (TW)

( * ) Notice: Subject to any disclaimer, the term of this patent is extended or adjusted under 35 U.S.C. 154(b) by 0 days.

(21) Appl. No.: 10/134,487

(22) Filed: Apr. 30, 2002

(51) Int. Cl.[7] ................................................. H05K 7/20
(52) U.S. Cl. ........................ 361/719; 174/252; 257/713; 361/705; 361/761
(58) Field of Search ...................... 174/52.2, 252; 165/80.3, 185; 257/706, 707, 713, 787; 361/717–719, 720, 704, 705, 707, 709–712, 761, 764

(56) References Cited

U.S. PATENT DOCUMENTS

| | | | |
|---|---|---|---|
| 5,355,283 A | | 10/1994 | Marrs et al. |
| 5,475,565 A | * | 12/1995 | Bhattacharyya et al. ..... 361/719 |
| 5,578,796 A | * | 11/1996 | Bhatt et al. ................. 174/260 |
| 5,920,117 A | * | 7/1999 | Sono et al. .................. 257/675 |
| 6,081,426 A | * | 6/2000 | Takeda et al. ............... 361/704 |
| 6,459,163 B1 | * | 10/2002 | Bai ............................. 257/787 |
| 6,486,537 B1 | * | 11/2002 | Liebhard ..................... 257/667 |
| 2002/0038908 A1 | * | 4/2002 | Ding et al. |

* cited by examiner

*Primary Examiner*—Gerald Tolin
(74) *Attorney, Agent, or Firm*—Browdy and Neimark, P.L.L.C.

(57) ABSTRACT

A thermally enhanced IC chip package has a dielectric substrate member with conductive circuit patterns on top and bottom surfaces thereof and an opening therethrough. An IC chip having active and inactive sides is received in the opening. The active side of the chip and the top surface of the substrate face to a same direction and electrically connect each other. A thermally and electrically conductive adhesive layer is disposed on the inactive side of the chip and the bottom surface of the substrate in a completely enclosing shape around the opening. A thermally and electrically conductive planar member is attached to the thermally and electrically conductive adhesive layer. A molding material encapsulates the chip, the opening and the top surface of the substrate.

4 Claims, 3 Drawing Sheets

THERMALLY ENHANCED IC CHIP PACKAGE

BACKGROUND OF THE INVENTION

1. Field of the Invention

The present invention relates generally to an integrated circuit (IC) chip package, and more particularly to a low cost, high performance IC chip package with enhanced thermal capabilities.

2. Description of the Prior Art

The U.S. Pat. No. 5, 355,283 discloses a prior art thermally enhanced IC chip package, as shown in FIG. 1, which includes a substrate 1 with a central hole 2. The substrate 1 is bonded to a heat sink 3, which can be formed of copper or other materials having an acceptably high thermal conductivity, by an adhesive 4 such as an epoxy adhesive. An IC chip 5 is also bonded to the heat sink 3 by adhesive 4 within the central hole 2, which is subsequently filled with an encapsulant 6.

Such a conventional IC chip package as described above can provide good heat transfer away from the chip for the presence of the heat sink in the package, particularly since most of the heat sink surface is exposed the exterior of the package. However, it has some drawbacks. The differences in coefficients of thermal expansion between the heat sink 3 and the substrate 1 create stress in the adhesive layer 4. This is exaggerated by differences in heating and cooling rates. The heat sink 3 is heated directly by conduction through a relatively large area of an adhesive patch 7. The substrate 1 is heated less directly by conduction through the heat sink 3 and through the encapsulant 6. Thus, there are likely to be cyclical temperature differences that exaggerate differences in expansion due to differences in coefficient of thermal expansion. Moreover, the processes to implement an integral heat sink into the substrate are relatively complex and expensive.

SUMMARY OF THE INVENTION

It is therefore the primary objective of the present invention to provide a thermally enhanced IC chip free from the drawbacks of the prior art IC chip package.

It is another objective of the present invention to provide a thermally enhanced IC chip package which is cost-effective for not using chip attached epoxy adhesive layers and heat spreaders.

It is still another objective of the present invention to provide a thermally enhanced IC package having superior heat dissipation characteristics and good electrical performance.

In keeping with the principle of the present invention, the foregoing objectives of the present invention are attained by the thermally enhanced IC chip package comprising a substrate member having planar opposing top and bottom surfaces with conductive circuit patterns and an opening. A plurality of solder balls are electrically connected the bottom surface of said substrate member. An IC chip having an active side and an inactive side is received in the opening of the substrate in such a way that the active side of the chip and the top surface of the substrate face to a same direction. The active side of the chip is electrically connected with the top surface of the substrate. A thermally and electrically conductive adhesive layer is disposed on the inactive side of the chip and on the bottom surface of the substrate in a completely enclosing shape around the opening. A thermally and electrically conductive planar member having top and bottom surfaces is attached to the thermally and electrically conductive adhesive layer with the top surface thereof. A molding material encapsulates the chip, the opening and the top surface of the substrate.

The foregoing objectives, features, and advantages of the present invention will be more readily understood upon a thoughtful deliberation of the following detailed description of a preferred embodiment of the present invention with reference to the accompanying drawings.

BRIEF DESCRIPTION OF THE DRAWINGS

As shown in FIGS. 2 and 3, there depicts an embodiment of a package 10 within the present invention. The package 10 includes a substrate or board 12 formed of a suitable dielectric, or insulative, material. The substrate 12 has a top surface 14 and bottom surface 16 with conductive circuit patterns 18. A plurality of solder balls 20 are attached at respective ones of the mounting pads 22 on the bottom surface 16. A central window, or opening 24, of a particular size and shape, is formed through the thickness of the substrate 12.

Figure 1:
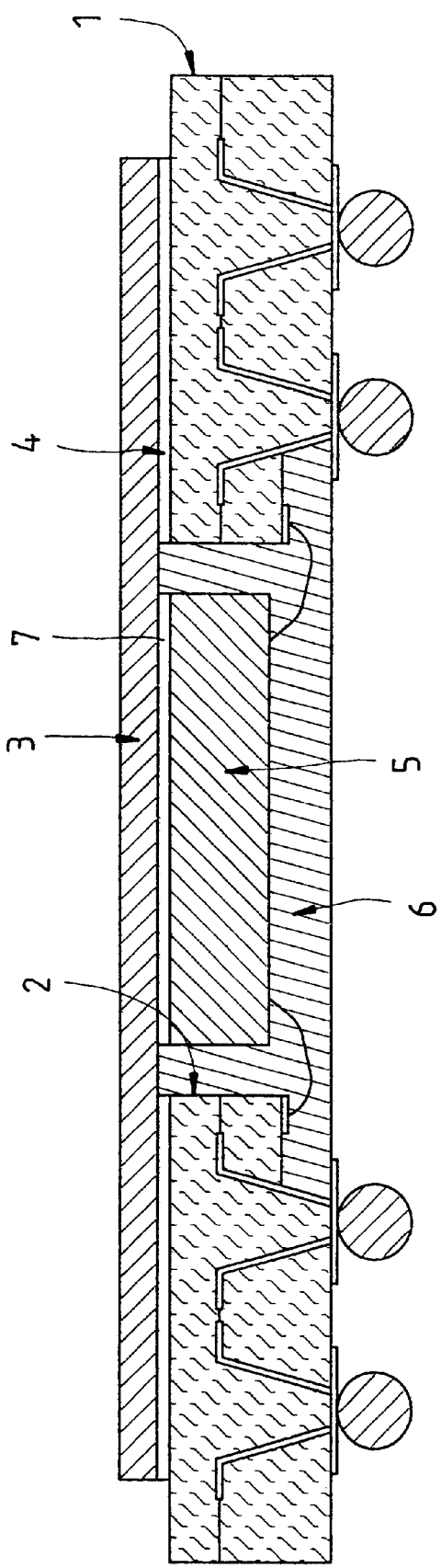
FIG. 1 is an elevation view of a prior art thermally enhanced IC chip package.
Figure 2:
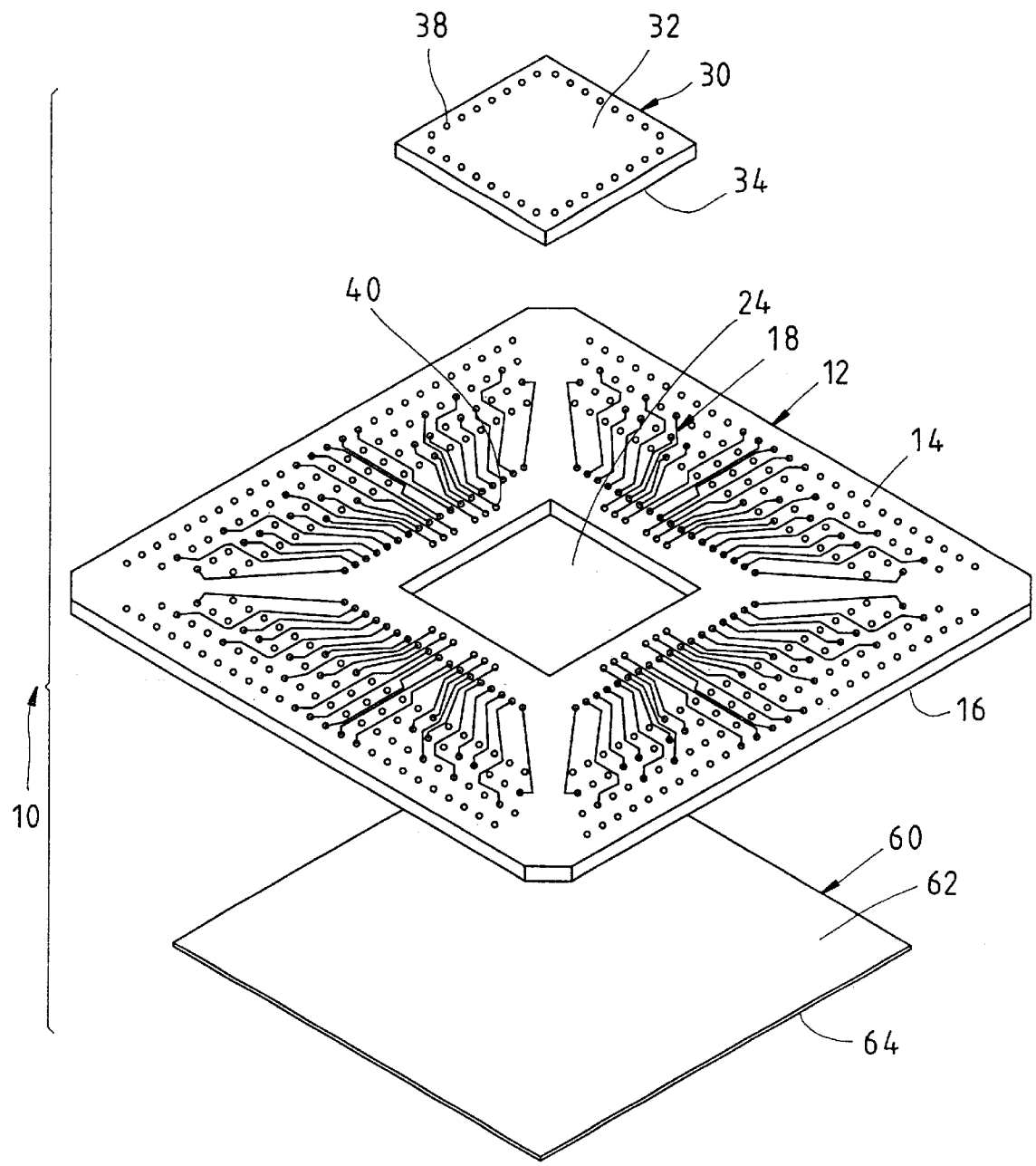
FIG. 2 is an exploded view of an IC chip package constructed in accordance with an embodiment of the present invention.
Figure 3:
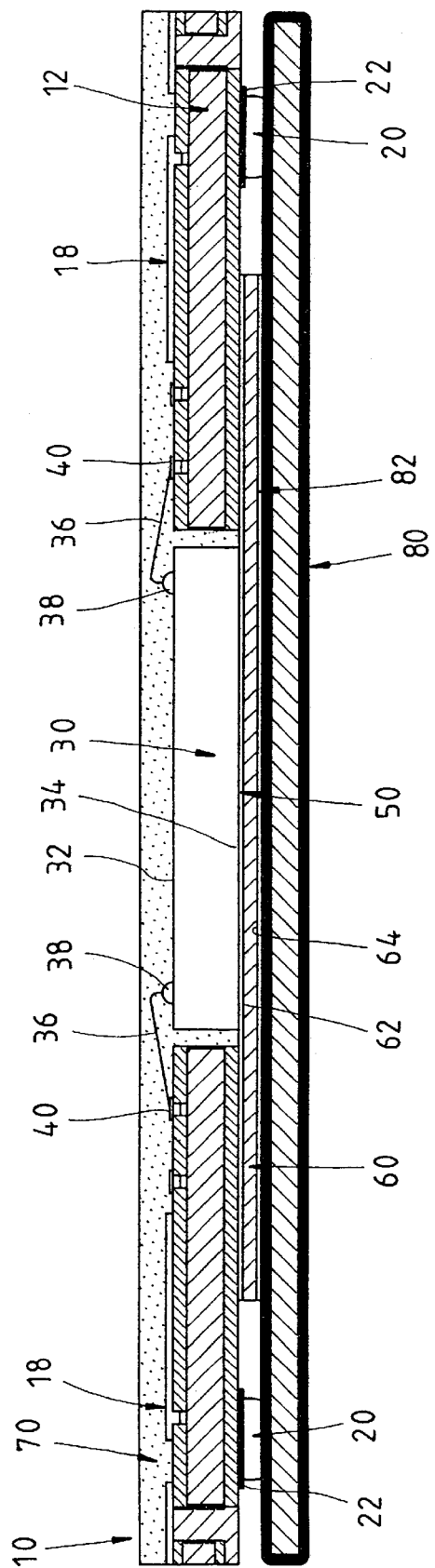
FIG. 3 is an elevation view of the assembled package as seen in FIG. 2.

An IC chip 30 has an active side 32 and an inactive side 34. The chip 30 is received in the opening 24. A plurality of fine wires 36, e.g., gold wires, interconnect wire bonding pads 38 on the active side 32 of the chip 30 to respective ones of the contact pads 40 on the top surface 14 of the substrate 12.

A thermally and electrically conductive adhesive layer 50, e.g., a copper paste, is disposed on the inactive side 34 of the chip 30 and on the bottom surface 16 of the substrate 12 in a completely enclosing shape around the opening 24.

A thermally and electrically conductive planar member 60, e.g., a copper plate, has a top surface 62 and a bottom surface 64. The member 60 is bonded to the thermally and electrically conductive adhesive layer 50 with the top surface 62. A liquid encapsulant 70 encapsulates the chip 30, the top surface of the substrate 12 and fills the opening 24.

When being used, the package 10 is solder-mounted to a main, or "mother," board 80 by the solder balls 20 attached at the substrate 12. The bottom surface 64 of the thermally and electrically conductive planar member 60 is bonded to the main board 80 by an adhesive tape 82 made of thermally and electrically conductive material. This allows that the heat generated by the IC chip 30 is directly transferred through the thermally and electrically conductive planar member 60 to main board 80 (the whole system), and the electrical circuits of the package is directly grounded to the main board 80 via the thermally and electrically conductive planar member 60. As a result, the thermally enhanced IC package provided by the present invention has superior heat dissipation characteristics and good electrical performance. Furthermore, it will not exaggerate differences in expansion due to differences in coefficient of thermal expansion.

In addition, for not using any chip attached material, e.g., epoxy adhesive layers and heat spreader, the IC chip package provided by the present invention effectively simplifies the manufacturing processes and reduces the packaging costs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A thermally enhanced IC chip package comprising:
    a dielectric substrate member having top and bottom surfaces with conductive circuit patterns, and an opening therethrough;
    a plurality of solder balls being electrically connected to said bottom surface of said substrate member;
    an IC chip having an active side and an inactive side, said chip being received in said opening of said substrate in such a way that said active side of said chip and said top surface of said substrate face to a same direction, said active side electrically connected with said top surface of said substrate;
    a thermally and electrically conductive adhesive layer disposed on said inactive side of said chip and on said bottom surface of said substrate in a completely enclosing shape around said opening;
    a thermally and electrically conductive planar member having top and bottom surfaces, said planar member being attached to said thermally and electrically conductive adhesive layer with said top surface thereof; and
    a molding material encapsulating said chip, said opening and said top surface of said substrate.

2. The IC chip package of claim 1, wherein said thermally and electrically conductive planar member is a copper thin plate.

3. The IC chip package of claim 1, wherein said thermally and electrically conductive adhesive layer is a copper paste. electrically conductive planar member is a copper thin plate.

4. The IC chip package of claim 1, wherein said electrical connection between said chip and said top surface of said substrate is wire bonds.

* * * * *